United States Patent
Robillon et al.

(10) Patent No.: US 10,757,841 B2
(45) Date of Patent: Aug. 25, 2020

(54) HEAT EXCHANGE DEVICE FOR A MOTOR VEHICLE, COMBINING A THERMOELECTRIC MODULE AND A HEAT EXCHANGER WITH CIRCULATION OF A FLUID

(71) Applicant: Valeo Systemes Thermiques, Le Mesnil Saint Denis (FR)

(72) Inventors: Lionel Robillon, Le Mesnil Saint Denis (FR); Mohamed Ibrahimi, Le Mesnil Saint Denis (FR); Jean Damien Muller, Le Mesnil Saint Denis (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 0 days.

(21) Appl. No.: 16/336,277

(22) PCT Filed: Sep. 27, 2017

(86) PCT No.: PCT/FR2017/052610
§ 371 (c)(1),
(2) Date: Jun. 17, 2019

(87) PCT Pub. No.: WO2018/060605
PCT Pub. Date: Apr. 5, 2018

(65) Prior Publication Data
US 2019/0313553 A1 Oct. 10, 2019

(30) Foreign Application Priority Data
Sep. 27, 2016 (FR) ..................... 16 59098

(51) Int. Cl.
*H05K 7/20* (2006.01)
*F25B 21/02* (2006.01)
*F28F 3/12* (2006.01)

(52) U.S. Cl.
CPC ......... *H05K 7/20872* (2013.01); *F25B 21/02* (2013.01); *F28F 3/12* (2013.01);
(Continued)

(58) Field of Classification Search
CPC ........... H05K 7/20254; H05K 7/20872; H05K 7/20927; F25B 21/02; F25B 2321/023; F28F 3/12; F28F 2210/10
See application file for complete search history.

(56) References Cited

U.S. PATENT DOCUMENTS 5,918,469 A 7/1999 Cardella
2003/0140636 A1* 7/2003 Van Winkle ............ H01L 35/30
62/3.61
(Continued)

FOREIGN PATENT DOCUMENTS

DE 10 2012 222635 A1 6/2014
EP 0952017 A2 10/1999
EP 2802198 A2 11/2014

OTHER PUBLICATIONS

International Search Report and Written Opinion in corresponding International Application No. PCT/FR2017/052610, dated Feb. 7, 2018 (12 pages).

*Primary Examiner* — Jacob R Crum
(74) *Attorney, Agent, or Firm* — Osha Liang LLP

(57) ABSTRACT

The invention relates to a device (2) dedicated to heat treatment of an electric member (1) fitted to a motor vehicle, the device (2) comprising a Peltier-effect thermoelectric module (4) connected to one of the large faces (9, 10) of a casing (6) housing a circuit (5) for heat transfer fluid F, characterised in that, in the direction S of circulation of the heat transfer fluid F through the circuit (5), the circuit (5) comprises at least two successive fluid paths respectively arranged in distinct zones of the casing (6), including at least one upstream fluid path (5a) arranged inside a first zone Z1

(Continued)

Figure 1:
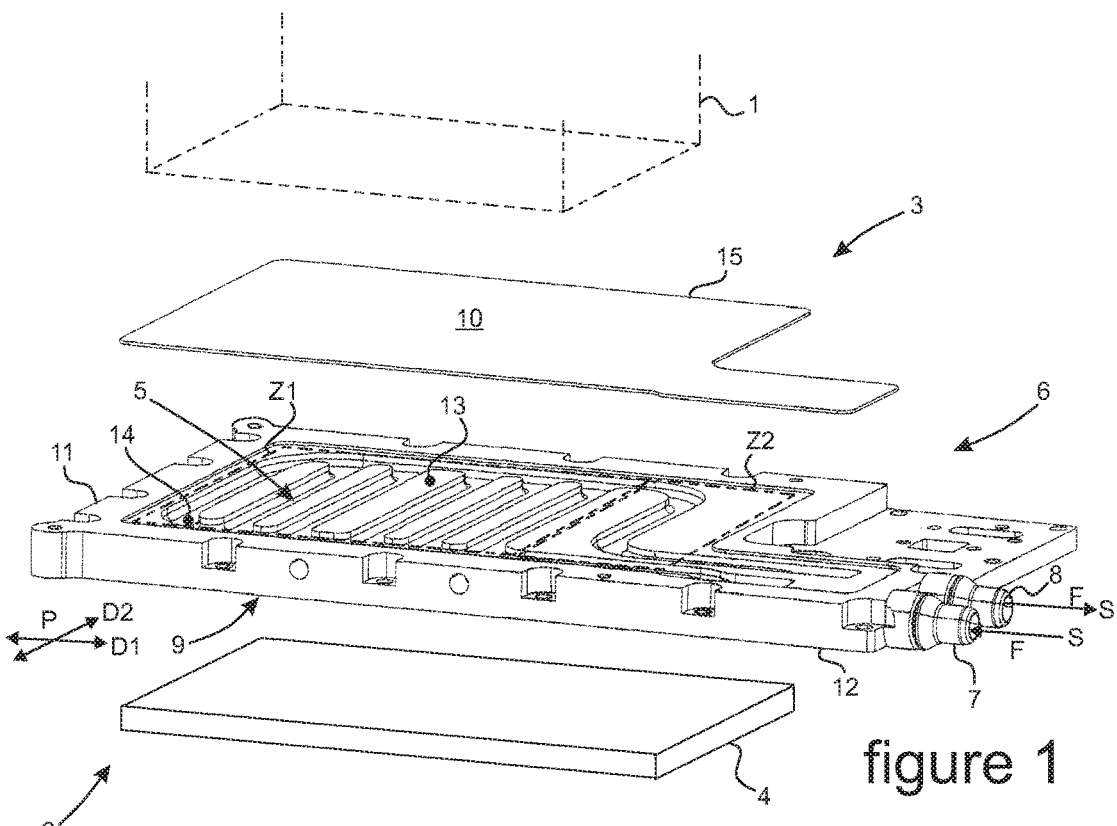

and at least one downstream fluid path (5*b*) arranged inside a second zone, the casing (6) being delimited by a first large face (9) thermally connected to the thermoelectric module (4) and by a second large face (10) arranged to be thermally connected to the electric member (1).

15 Claims, 3 Drawing Sheets

(52) U.S. Cl.
CPC ..... *H05K 7/20254* (2013.01); *H05K 7/20927* (2013.01); *F25B 2321/023* (2013.01); *F28F 2210/10* (2013.01)

(56) References Cited

U.S. PATENT DOCUMENTS

| | | | |
|---|---|---|---|
| 2004/0008487 A1 | 1/2004 | Hisano et al. | |
| 2005/0103041 A1* | 5/2005 | Krempel | G05D 23/08 62/383 |
| 2005/0174737 A1* | 8/2005 | Meir | G06F 1/206 361/697 |
| 2006/0012034 A1* | 1/2006 | Kadoya | H05K 1/0203 257/712 |
| 2007/0017658 A1* | 1/2007 | Lehman | H05K 7/20254 165/80.4 |
| 2007/0163765 A1* | 7/2007 | Rondier | H01L 23/473 165/170 |
| 2011/0100666 A1* | 5/2011 | Wu | H05K 7/20872 174/15.1 |
| 2012/0073276 A1* | 3/2012 | Meisner | H01L 35/30 60/320 |
| 2012/0320529 A1* | 12/2012 | Loong | H01L 23/3735 361/702 |
| 2014/0013774 A1 | 1/2014 | Grunwald et al. | |
| 2015/0000308 A1* | 1/2015 | Roll | F25B 21/02 62/3.2 |

\* cited by examiner

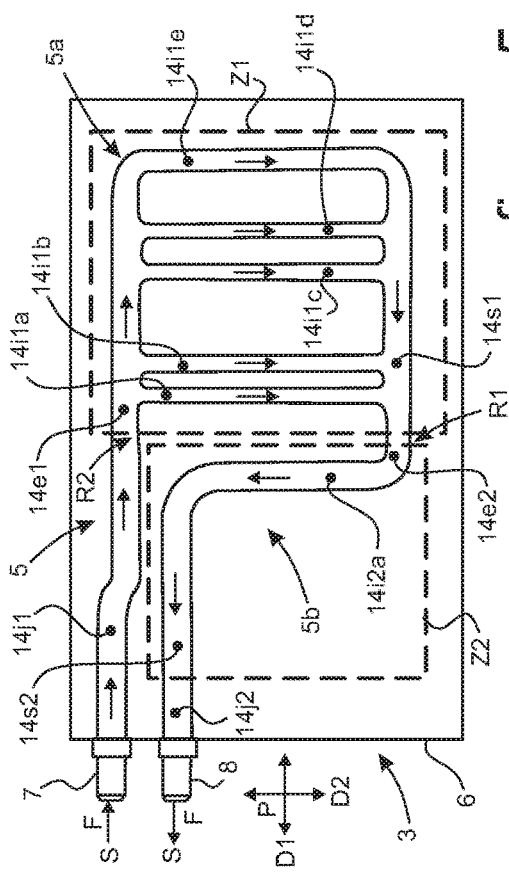
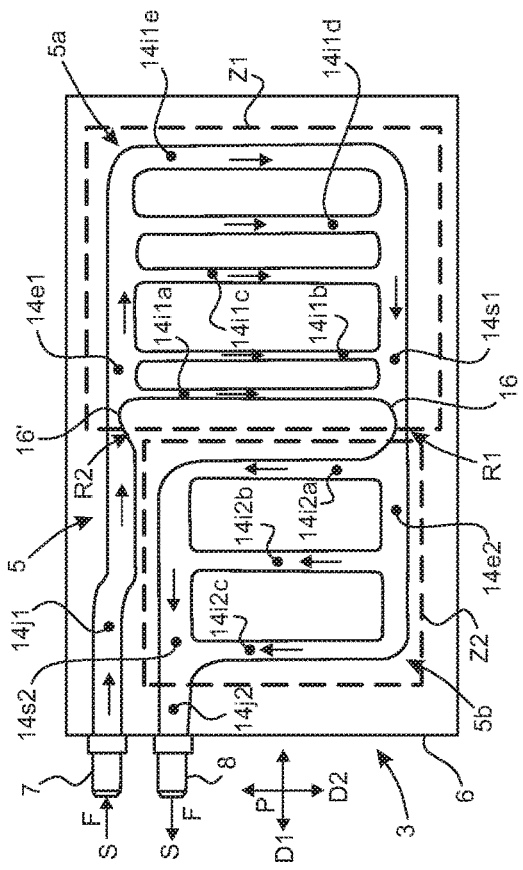
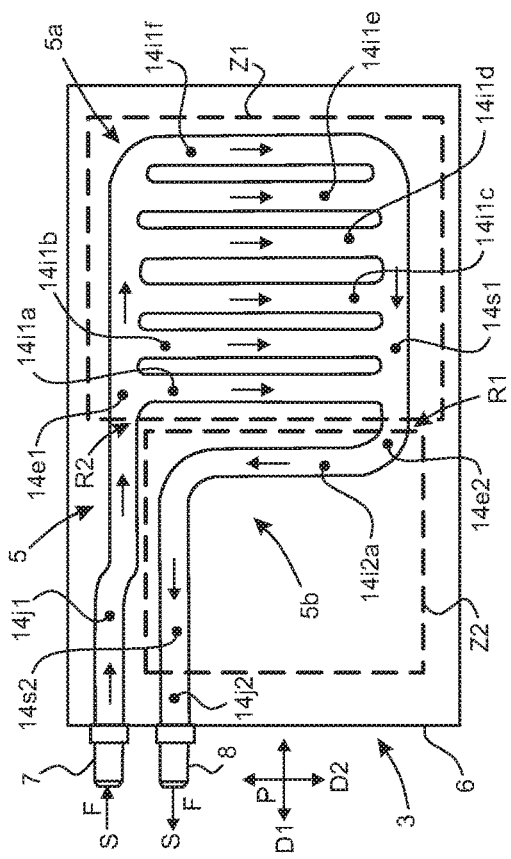
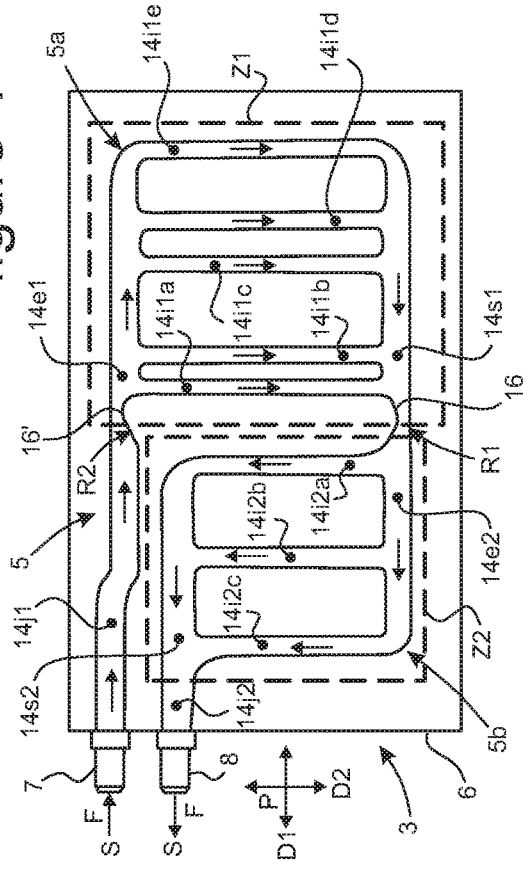

HEAT EXCHANGE DEVICE FOR A MOTOR VEHICLE, COMBINING A THERMOELECTRIC MODULE AND A HEAT EXCHANGER WITH CIRCULATION OF A FLUID

The present invention relates to the field of heat exchange devices for thermally processing electrical components, in particular power components, with which motor vehicles are provided. The present invention is based more specifically on such a heat exchange device, comprising a thermoelectric module with a Peltier effect which is thermally connected to a heat exchanger for circulation of a heat transfer fluid.

Amongst motor vehicles, some are provided with an electric motorization for the propulsion thereof. This is particularly the case for vehicles whose propulsion involves electric motorization alone, or for vehicles whose propulsion involves hybrid motorization which combines an electric motorization and a combustion type motorization. Such vehicles are provided for their propulsion with an electric motor and electrical power components which are dedicated to the operation thereof. These electrical power components comprise in particular a module for controlling the operation of the electric motor and an electrical energy store which comprises one or more batteries.

However, electrical power components which are involved in the supply of energy to the electric motor are subjected to temperature variations which are capable of affecting their performance and/or damaging them. Such temperature variations are in particular generated in accordance with the climatic conditions and/or by the operation of the electrical components which cause them to become heated.

Consequently, it is conventional to thermally process the electrical components of the motor vehicle in order to preserve them and/or to maintain their performance. The document US 2014 013 774 (BEHR GmbH & Co. KG) describes such a heat exchange device which is dedicated to cooling an electrical energy store which is intended to supply energy to an electric motor which drives a motor vehicle.

According to this document US 2014 013 774, the heat exchanger is formed by a casing which accommodates a circuit for directing the heat transfer fluid through it. The circuit is constituted by a plurality of channels which are successively connected to each other. Two adjacent channels direct the fluid in opposing circulation directions of the fluid through the circuit. The thermoelectric module is composed of a plurality of thermoelectric elements with a Peltier effect which are placed against one of the faces of the casing. The thermoelectric elements are thus interposed between the casing and a plate which forms a battery support which constitutes the electrical energy store.

Such an arrangement leaves room for improvement in that it is not entirely satisfactory. This is because the interposition of the thermoelectric module between the casing and the batteries impedes the heat transfer between these two components.

The invention is intended to improve the situation.

In this context, the present invention relates to a heat exchange device which is dedicated to the thermal processing of an electrical component, for example, a power component, with which a motor vehicle is provided. The heat exchange device of the present invention comprises a thermoelectric module with a Peltier effect which is thermally connected to one of the large faces of a heat exchanger for circulation of a heat transfer fluid which constitutes the device according to the invention.

The object of the present invention is to optimize the use of the heat capacities of the heat transfer fluid flowing through the device according to the invention, in the context of a thermal connection between a casing which constitutes the device according to the invention and which forms a heat exchanger with the thermoelectric module and a thermal connection of this same casing with the electrical component which is intended to be thermally processed.

According to a general approach of the present invention, the heat exchanger is arranged in a casing which is, for example, flat and which accommodates a routing circuit for a heat transfer fluid. The heat transfer fluid is capable of being a liquid or a refrigerating fluid, glycol water or any other fluid which is capable of storing, capturing and/or returning thermal energy.

Such a casing is delimited at least by the large faces thereof. They are opposed and form seats for receiving the thermoelectric module and the electrical component which is intended to be thermally processed. In this manner, the casing is in physical contact with the thermoelectric module at one of the large faces thereof and with the electrical component at the other of the large faces thereof.

In this context and as a result of the circulation of the heat transfer fluid through the circuit, the large faces of the casing are provided with a heterogeneous surface power density. The differing thermal exchanges of the heat exchanger with the thermoelectric module and the electrical component, respectively, are used to homogenize the distribution of the surface temperature of the casing, individually on the large faces thereof in particular, and to maintain the differing heat exchanges at permitted respective temperature difference thresholds.

To this end, the circuit is subdivided into at least two fluid paths which are connected in series and which are provided in different zones of the casing. The heat transfer fluid may then flow successively through an upstream fluid path which is provided in a first zone of the casing, then through a downstream fluid path which is provided in a second zone of the casing. The notions upstream and downstream are of course intended to be understood in the circulation direction of the heat transfer fluid through the circuit.

The first zone of the casing thermally processes primarily the component assigned to this zone, for example, by removing or providing heat from the heat transfer fluid flowing through the upstream fluid path. The second zone of the casing thermally processes in a secondary manner the component assigned to this second zone by providing or removing the remainder of the heat of the heat transfer fluid flowing through the downstream fluid path.

The device according to the invention advantageously comprises at least any one of the following features, taken alone or in combination:

the first zone and the second zone each extend at least partially over the extent of a first contact surface between the casing and the thermoelectric module and over a second surface of the casing which is capable of coming into contact with the electrical component, the fluid paths are arranged with spacing from each other, providing a thermal break zone between the first zone and the second zone, at least the upstream fluid path comprises a plurality of intermediate channels which connect in parallel the inlet channel and the outlet channel of the upstream fluid path, the downstream fluid path comprises a plurality of intermediate channels which connect in parallel the inlet channel and the outlet channel of the downstream fluid path, each of the fluid paths comprises, on the one hand, an inlet channel and an outlet channel for the heat transfer fluid which extends along a length of the casing and, on the other hand, at least one intermediate channel which connects the inlet channel and the outlet channel to each other and which extends over a width of the casing. Advantageously, the casing is flat and rectangular, the intermediate channels have identical or different cross-sections, a cross-section of the intermediate channels is less than a cross-section of the inlet channel and/or the outlet channel, the intermediate channels change direction at least twice in their main direction of extent. According to this variant, the intermediate channels form zigzags within the casing, at least one of the channels forming the circuit comprises at least one restriction of the passage cross-section of the heat transfer fluid, the restriction is provided locally in the region of the inlet channel. According to one example, this restriction is located at the inlet of the zone concerned. This restriction locally accelerates the heat transfer fluid to ensure good filling of the intermediate channels, in particular those which are remote from the portion which supplies the intermediate channels. In this manner, the speed of the fluid may be accelerated, in particular in introduction zones for the fluid inside one and/or the other of the fluid paths, for example, a first restriction is provided on the outlet channel of the upstream fluid path, downstream of the intermediate channel(s) of the upstream fluid path in the circulation direction of the fluid through the circuit. The circulation speed of the fluid is thus increased at the inlet of the downstream fluid path, again by way of example, a second restriction is provided on the inlet channel of the upstream fluid path, upstream of at least one intermediate channel of the upstream fluid path in the circulation direction of the fluid through the circuit. The circulation speed of the fluid is thus increased at the inlet of the upstream fluid path, again by way of example, at least a third restriction is provided on at least any one of an intermediate channel of at least one given fluid channel. Such arrangements enable control in a specific circuit of the circulation speed of the fluid through the intermediate channels which it comprises, the cross-section of at least any one of the channels forming the circuit is variable, the circuit is connected to at least one inlet mouth which forms a pipe for introducing the heat transfer fluid inside the circuit, and at least one outlet mouth which forms a pipe for discharging the heat transfer fluid out of the circuit, the inlet mouth and the outlet mouth each opening outside the casing at any one of the lateral faces thereof which extend between the large faces thereof. More specifically, it is mentioned that the inlet mouth is connected to the inlet channel of the upstream fluid path and the outlet mouth is connected to the outlet channel of the downstream fluid path, the casing is formed by a hollow body which delimits a cavity which forms the circuit, the body incorporating at least one partition which delimits at least the fluid path, the cavity being closed by at least one cover, a base of the body forming the first large face of the casing and the cover forming the second large face of the casing. It should be noted that the cover is advantageously formed by a plate which rests on a plurality of partitions which are provided in the cavity. The seat provided by portions of the partitions on which the cover rests enables the mechanical retention of the cover to be supported, in spite of the variations of temperature to which the casing may be subjected. Furthermore, the thermal exchange is promoted between the cover and the electrical component or the thermoelectric module, to which the cover is thermally connected. This is because the heat transfer fluid is directly in contact with the cover, the body is formed by an integral component which may be produced equally well by molding or by machining a metal component.

The invention also relates to a cooling system comprising a device as described in the present document and an electrical component, in particular a power component, with which a motor vehicle is provided, the electrical component being in thermal contact with the second large face which delimits the casing.

The fluid paths are each composed of a plurality of channels, including in particular for each of the fluid paths an inlet channel of the heat transfer fluid and an outlet channel of the heat transfer fluid. For each of the fluid paths, the inlet channel and the outlet channel are connected to each other by one or preferably more intermediate channels which are interposed in parallel between the inlet channel and the outlet channel. The inlet channel of the upstream fluid path is connected to an inlet mouth through which the heat transfer fluid is introduced inside the circuit. The outlet channel of the upstream fluid path is connected to the inlet channel of the downstream fluid path. The outlet channel of the downstream fluid path is then connected to an outlet mouth through which the heat transfer fluid is discharged out of the circuit.

In this context, the methods of fluid circulation through the circuit in series, that is to say, successively through the upstream fluid path and the downstream fluid path, may be organized in order to produce the desired thermal exchanges between the heat transfer fluid and the different zones of the casing, respectively. More specifically, the methods of fluid circulation through the circuit are advantageously regulated based on specific arrangements of the fluid paths. Such a regulation is in particular obtained in accordance with the number, the distribution and/or the overall or localized cross-sections of the different channels which form each of the fluid paths, respectively.

With regard to the structural arrangement of the casing, it is proposed to form it from a generally flat body which delimits the inner spacing of the casing, the body being covered by a cover for closing the hollow inner space thereof. The base of the casing provides one of the large faces of the casing and the cover provides the other of the large faces of the casing. The body is internally partitioned in order to provide the different channels which form the upstream fluid path and the downstream fluid path, respectively. The body is capable of being formed by machining a metal component or by means of molding, for example, by incorporating partitions which provide between them the different channels of the circuit.

The thermoelectric module is, for example, placed against the outer surface of the base of the casing, the electrical component being placed against the outer surface of the cover arranged in a plate-like manner. Conversely, the electrical component is capable of being placed against the outer surface of the base of the casing and the thermoelectric module against the outer surface of the cover.

The electrical component is in particular an electrical power component, such as, for example, an electrical energy store or a module for controlling the operation of an electric drive motor of the motor vehicle. It should be noted that other electrical components, such as, for example, electric and/or electronic control components and/or modules, may be thermally connected to any one of the large faces of the casing, individually or in combination with the electrical components mentioned above.

It should be noted that the first zone which corresponds to the upstream fluid path may be assigned to the thermal processing of a DC/DC current converter, whilst the second zone which corresponds to the downstream fluid path may be assigned to the thermal processing of a control module which processes, for example, signal information. Such an organization enables greater cooling to be assigned to the first zone than to the second zone, for example, as a result of the fact that the DC/DC converter becomes more heated than the control module.

It should be noted that the first large face and/or the second large face of the casing are capable of being thermally connected not only to the electrical component and to the thermoelectric module, respectively, but also to any other appended electric and/or electronic component(s) and/or module(s) which are intended to be thermally processed, such as electric and/or electronic component(s), including one or more appended thermoelectric modules.

Furthermore, it should be understood that in the case of thermal processing between the casing and any thermoelectric module which is thermally connected to one or other of the large faces of the casing, the thermal processing carried out is capable of being a cooling or heating of the thermoelectric module in accordance with the direction of the electric current flowing through the thermoelectric element(s) of which it is composed.

According to an embodiment, the thermal connections of the casing with the thermoelectric module and the electrical component, respectively, are advantageously produced by means of mutual mechanical contact.

More specifically, the thermoelectric module is placed in mechanical contact against the outer surface of a first large face of the casing, in particular over an extent corresponding to a first contact surface. The electrical component is placed in mechanical contact against the outer surface of the second large face of the casing, in particular over an extent corresponding to a second contact surface.

Such mechanical contacts are advantageously produced by placing the thermoelectric module and/or the electrical component directly against the outer faces of the first large face and the second large face of the casing, respectively.

According to the invention the first zone and the second zone preferably each extend at least partially over the extent of a first contact surface between the casing and the thermoelectric module and over a second contact surface between the casing and the electrical component. It will be appreciated that the first contact surface is formed completely or partially by the outer surface of the first large face and the second contact surface is formed completely or partially by the outer surface of the second large face of the casing.

The upstream fluid path and the downstream fluid path are preferably juxtaposed inside the casing along the same general extent plane of the circuit.

As set out above, the fluid paths are advantageously individually arranged so as to control the fluid circulation methods through the circuit. Such fluid circulation methods are based in particular on the flow rate, the speed thereof and overall the quantity of fluid flowing individually through the different channels which form one and the other of the fluid paths, respectively.

More specifically, the individual arrangement of the fluid paths is preferably different and brings about:
control of the fluid circulation methods through one or other of the fluid paths and thus control of the heat exchanges between the heat transfer fluid and the casing for a specific zone of the casing. That is to say, the arrangement of a specific fluid path enables the heat exchange between the heat transfer fluid and the zone of the casing which accommodates the specific fluid path to be controlled locally. In this manner and in accordance with the requirements for heat exchange between the casing, on the one hand, and the electrical power component and/or the thermoelectric module, on the other hand, the distribution of the surface temperature of one and/or the other of the zones can be controlled in order to obtain a homogeneous or heterogeneous temperature distribution,
control of the quantity of heat exchanged between the heat transfer fluid, on the one hand, and primarily the first zone and secondarily the second zone, on the other hand. In other words, the quantity of heat exchanged primarily with the first zone and secondarily with the second zone is advantageously controlled based on the respective arrangements of the upstream fluid path and the downstream fluid path.

Figure 2:
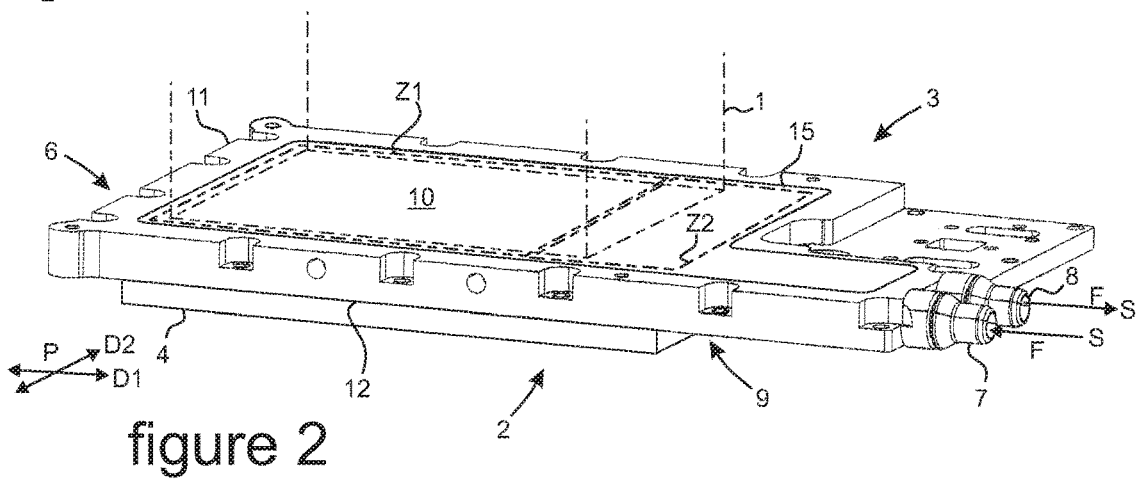
Figure 3:
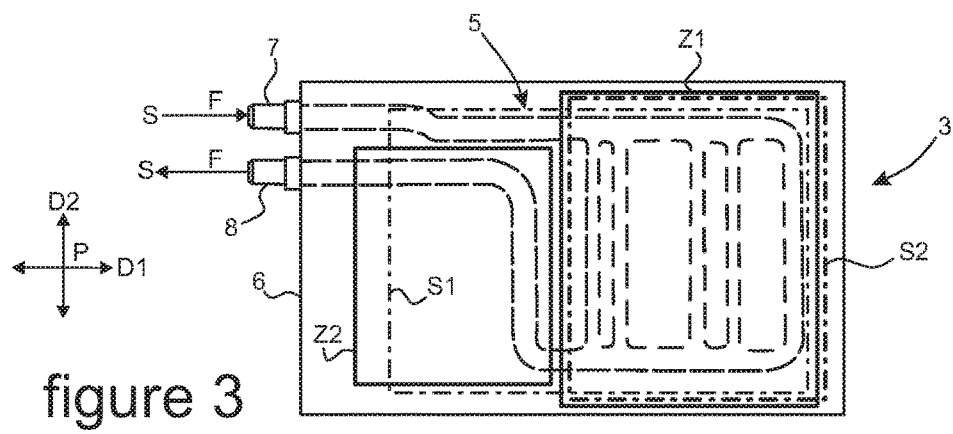
Figure 8:
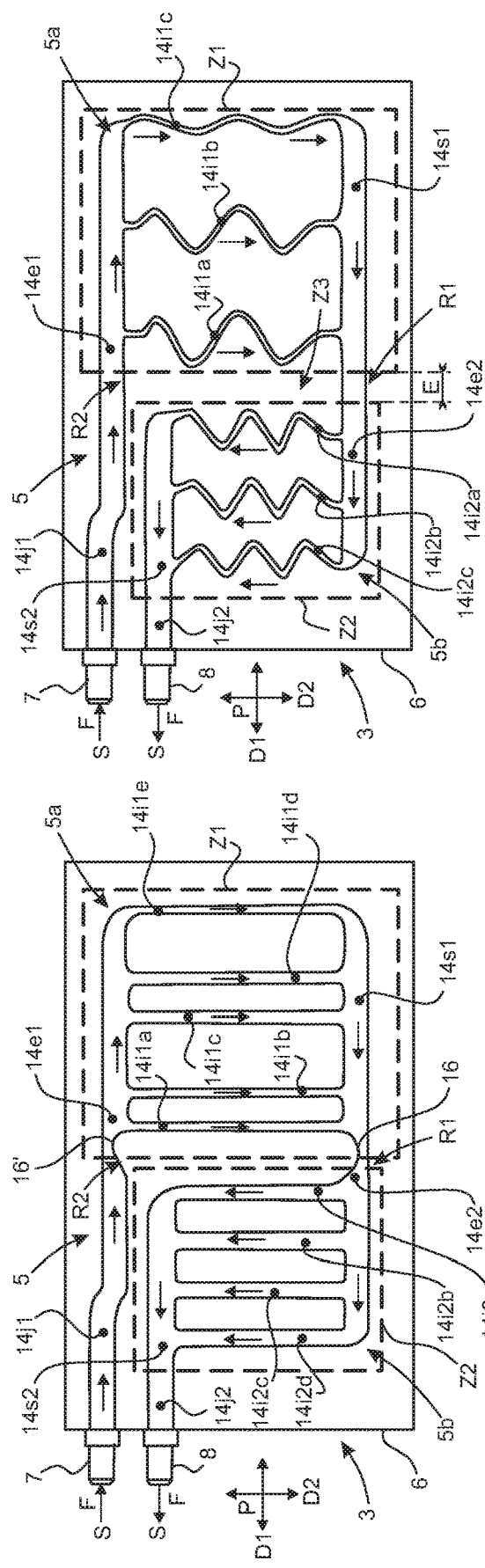
Figure 9:
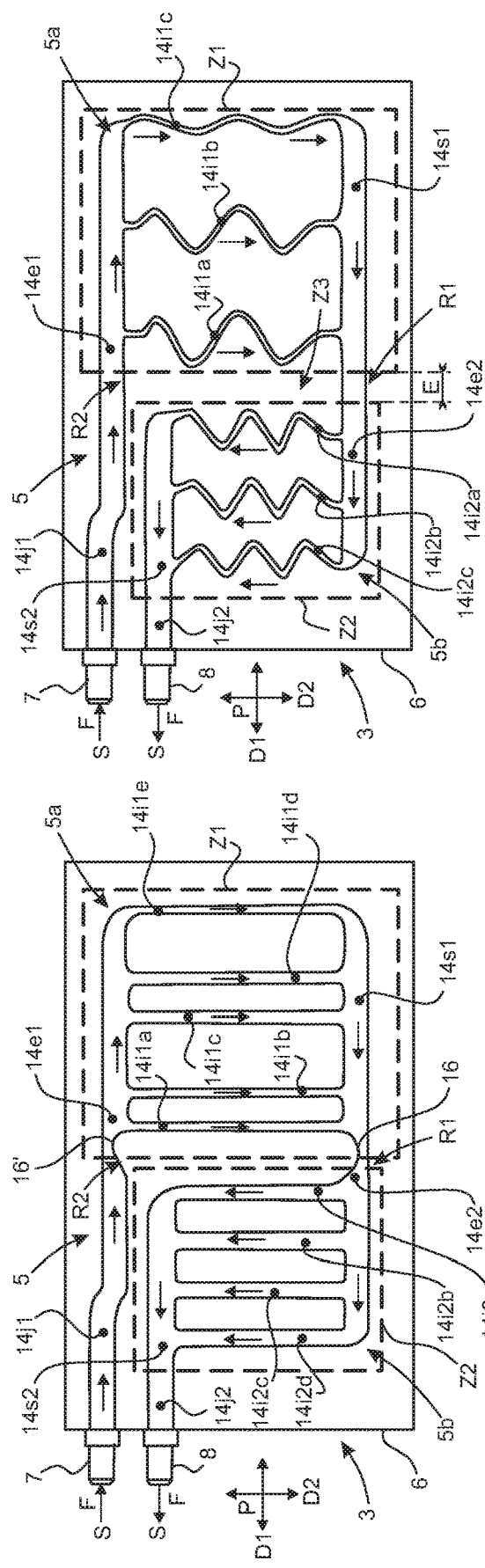
Figure 10:
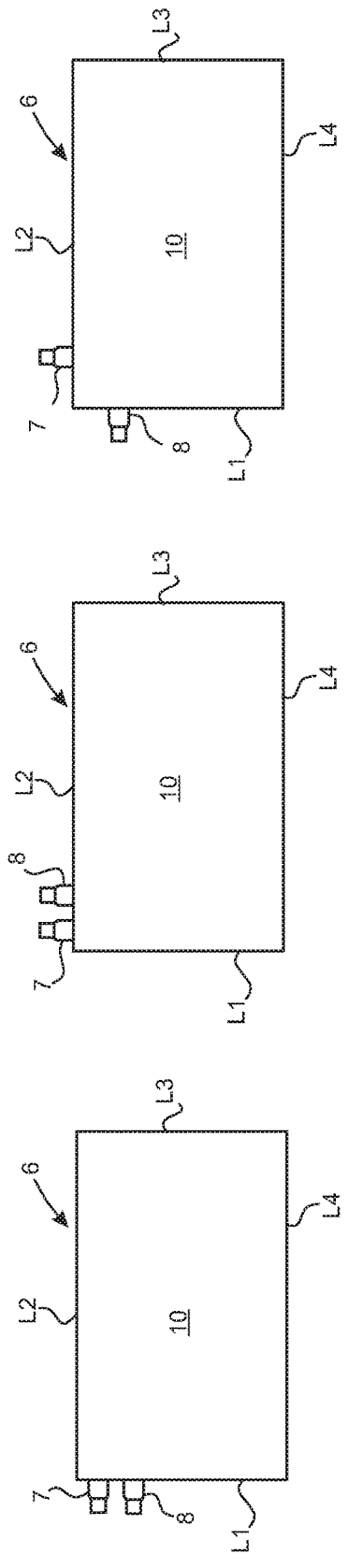
Figure 11:
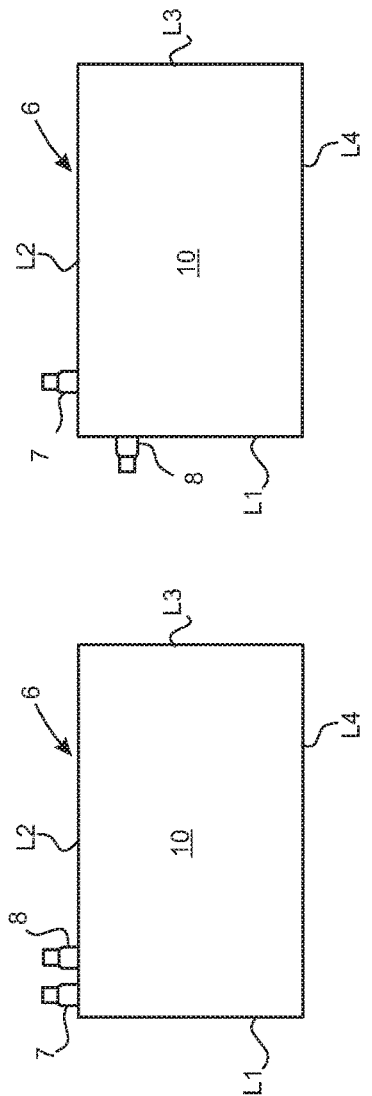
Figure 12:

Other characteristics, details and advantages of the present invention will be appreciated more clearly from a reading of the description thereof given below by way of example in relation to the different embodiments of the invention illustrated in the Figures of the sets of appended drawings, in which:

FIG. 1 and FIG. 2 are an exploded perspective view and assembled perspective view, respectively, of a heat exchange device according to the present invention, FIG. 3 is an illustration along the general plane of extent thereof of the device for heat exchange illustrated in FIG. 1, FIGS. 4 to 9 are illustrations, along the general plane, of a heat exchange device according to the present invention, according to different embodiments of a hydraulic circuit which the device comprises, FIGS. 10 to 12 are illustrations of different positions for forming an inlet mouth for fluid and an outlet mouth for fluid with which a heat exchange device according to the present invention is provided.

It should first be noted that the Figures set out the present invention in a detailed manner and in accordance with specific methods of implementation thereof. The Figures and their description may of course if necessary serve to better define the present invention, both in relation to the specific features thereof and generally, in particular in relation to the preceding description of the present invention.

Furthermore, in order to clarify and facilitate the reading of the above description of the present invention in relation to the Figures of the set of drawings, the common members illustrated in the different Figures are identified respectively in the descriptions relating to these Figures with the same reference numerals and/or letters without involving their individual illustration in each of the Figures and/or an identical arrangement of the common members between specific embodiments.

In FIG. 1 and FIG. 2, an electrical component 1, for example, a power component, with which a motor vehicle is provided, is provided to be thermally processed using a heat exchange device 2 according to the invention. The heat exchange device 2 comprises a generally planar heat exchanger 3 and a thermoelectric module 4. The heat exchanger 3 is of the type involving circulation of the heat transfer fluid F inside a circuit 5. The thermoelectric module 4 typically comprises at least one thermoelectric element with a Peltier effect.

The heat exchanger 3 is arranged in a casing 6, which is in particular flat and which accommodates the circuit 5, which extends along a plane P of extent of the casing 6 for directing the heat transfer fluid F through it. The circuit 5 comprises an inlet mouth 7 for introducing the heat transfer fluid F inside the circuit 5 and an outlet mouth 8 for discharging the heat transfer fluid F out of the circuit 5. The inlet mouth 7 and the outlet mouth 8 are provided to be connected to pipes for connecting the circuit to a source of heat transfer fluid.

The casing 6 comprises two large faces 9, 10 which are superimposed along the extent plane P thereof and which are used to thermally connect the heat exchanger 3 to the thermoelectric module 4 and the electrical component 1, respectively.

The outer surface of a first large face 9 of the casing provides a first reception surface by means of mechanical contact of the thermoelectric module 4. The outer surface of the second large face 10 of the casing provides a second reception surface by means of mechanical contact of the electrical component 1. With further reference to FIG. 3, the first surface S1 for receiving the thermoelectric module 4 and the second surface S2 for receiving the electrical component 1 are capable of completely or partially covering the large faces 9, 10 of the casing 6 which are assigned to them, respectively.

It can also be seen in FIGS. 10 to 12 that the inlet mouth 7 and the outlet mouth 8 are provided, preferably close to each other, on at least one of the lateral faces L1, L2, L3 and/or L4 of the casing 6 which extend(s) perpendicularly between the large faces 9, 10 thereof. The inlet mouth 7 and the outlet mouth 8 are capable of being provided on the same lateral face L1 or L2 of the casing 6, as illustrated in FIG. 10 and FIG. 11, respectively, or of each being provided on a lateral face L1 and L2 of the casing 6, preferably adjacent ones, as illustrated in FIG. 12.

In FIG. 1, the casing 6 is substantially formed by an integral body 11 whose base 12 forms the first large face 9 thereof. The inner space of the body 11 forms a cavity which is compartmentalized by partitions 13 which provide between them channels which form the circuit 5, such as the channel 14, for example, set out below in relation to FIGS. 4 to 9. The body 11 is covered by a cover 15 for closing the inner space thereof. The cover 15 forms the second large face 10 of the casing 6 in the example illustrated. Such a cover is advantageously a plate which is fitted in a fluid-tight manner to the body 11.

In FIGS. 3 to 9, the circuit 5 is composed of two successive fluid paths 5a, 5b which are provided in adjacent zones Z1, Z2 of the casing 6 along the extent of the plane P thereof. The zones Z1, Z2 of the casing 6 each extend continuously in adjacent respective spaces of the casing 6. In the flow direction S of the heat transfer fluid F through the circuit 5, the circuit 5 comprises a fluid path referred to as the upstream path 5a provided inside a first zone Z1 of the casing 6 and a so-called downstream fluid path 5b provided inside a second zone Z2 of the casing 6.

The first zone Z1 of the casing 6 removes or supplies primarily heat of the heat transfer fluid F which is introduced inside the circuit 5 and which flows through the upstream fluid path 5a. The heat transfer fluid F then flows through the downstream fluid path 5b and the second zone Z2 of the casing 6 removes or provides secondarily the heat of the heat transfer fluid F. In FIG. 3, the first surface S1 for receiving the thermoelectric module 4 and/or the second surface S2 for receiving the electrical component 1 are capable of extending at the respective large faces 9, 10 of the casing 6 completely or partially over the extent of the first zone Z1 and/or the second zone Z2.

According to the arrangement of the different fluid circuits 5 illustrated, for example, in FIGS. 4 to 9, respectively, the upstream fluid path 5a comprises therethrough a first inlet channel 14e1 for the heat transfer fluid F. A first connection channel 14j1 connects the first inlet channel 14e1 to the inlet mouth 7. The upstream fluid path 5a also comprises a first outlet channel 14s1 of the fluid F toward the downstream fluid path 5b. A plurality of first intermediate channels 14i1a-f each connect in parallel the first inlet channel 14e1 and the first outlet channel 14s1.

The downstream fluid path 5b comprises a second outlet channel 14s2 for the heat transfer fluid F, connected to the outlet mouth 8 via a second connection channel 14j2. The downstream fluid path 5b also comprises a second inlet channel 14e2 for the fluid connection thereof to the upstream fluid path 5a. To this end, the second inlet channel 14e2 is connected in extension of the first outlet channel 14s1 of the upstream fluid path 5a. The second inlet channel 14e2 and the second outlet channel 14s2 of the downstream fluid path 5b are connected to each other via at least a second intermediate channel 14i2a-d.

The first inlet channel 14e1, the first outlet channel 14s1 and the first connection channel 14j1, and the second inlet channel 14e2, the second outlet channel 14s2 and the second connection channel 14j2 are preferably orientated along the length D1 of the casing which defines the extent plane P thereof. The intermediate channels 14i, which comprise the first intermediate channels 14i1a-f and the second intermediate channel(s) 14i2a-d are preferably generally orientated along the width D2 of the casing 6 which defines the extent plane P thereof.

It may be noted, for example, in FIG. 9 that the main portion of the upstream fluid path 5a and the main portion of the downstream fluid path 5b are arranged spaced apart from each other. A spacing E provides an intermediate zone Z3 of the casing 6 which produces a thermal break between the first zone Z1 and the second zone Z2 of the casing 6. The notion of the main portion is intended to be understood with the exclusion outside the fluid paths 5a, 5b of their mutual connection zone R1. As a reminder, such a connection zone R1 is in particular at least provided by a connection between the first outlet channel 14s1 and the second inlet channel 14e2.

In order to vary the methods of circulation of the heat transfer fluid F through the circuit 5, the fluid paths 5a, 5b may each be arranged differently, as described below.

The upstream fluid path 5a preferably comprises a plurality of first intermediate channels 14i1a-f, as illustrated in FIGS. 3 to 9. The first intermediate channels 14i1a-f connect in parallel the first inlet channel 14e1 and the first outlet channel 14s1. The downstream fluid path 5b is capable of comprising a single second intermediate channel 14i2a, as illustrated in FIGS. 3 to 5, or a plurality of second intermediate channels 14i2a-d which connect in parallel the second inlet channel 14e2 and the second outlet channel 14s2, as illustrated in FIGS. 6 to 9.

The first intermediate channels 14i1a-f and the second intermediate channels 14i2a-d each in particular have a cross-section which is less than or equal to the cross-sections of the inlet channels 14e1, 14e2 and the outlet channels 14s1, 14s2 of one and the other of the upstream fluid path 5a and the downstream fluid path 5b, respectively. For a specific fluid path 5a, 5b, the intermediate channels 14i1a-f 14i2a-d are capable of being generally rectilinear, as illustrated in FIGS. 4 to 8, or of being shaped in a zigzag form in accordance with their main dimension, as illustrated in FIG. 9, that is to say, along the width of the casing 6. In this situation, the intermediate channels 14i1a-f, 14i2a-d change direction at least twice.

Furthermore, one or more intermediate channels 14i1a-f, 14i2a-d of one and/or the other of the fluid paths 5a, 5b may comprise a constant or variable cross-section. The intermediate channels 14i1a-f, 14i2a-d of one and/or the other of the fluid paths 5a, 5b may be of an identical or different number and/or may comprise identical or different individual cross-sections.

For example, in FIGS. 4 to 6 and in FIG. 9, the first intermediate channels 14i1a-f have identical cross-sections. The first intermediate channels 14i1a-f may also have different individual cross-sections, as illustrated in FIG. 5 and FIG. 8. By way of example, there are six first intermediate channels 14i1a-f in FIG. 4, five in FIGS. 5 to 8 and three in FIG. 9.

The cross-section of at least a first intermediate channel 14i1a-f and optionally of all the first intermediate channels 14i1a-f, is, for example, equal to the cross-section of the first inlet channel 14e1, as can be seen in FIG. 4.

It is also possible for the cross-section of at least a first intermediate channel 14i1a-f and optionally of all the first intermediate channels 14i1a-f to be, for example, less than the cross-section of the first inlet channel 14e1, as can be seen in FIGS. 5 to 7.

In FIGS. 5 and 6, the intermediate channels 14i1a-f have an identical cross-section, whilst the variant illustrated in FIG. 7 shows a progressive increase of the cross-section of the first intermediate channels 14i1a-f which develops along the length of the casing 6. In a specific manner, the first intermediate channel 14i1a arranged immediately beside the downstream fluid path 5b has the smallest cross-section of the first intermediate channels 14i1a-f. Optionally, the last intermediate channel 14i1e furthest away from the downstream fluid path 5b has the largest cross-section of the first intermediate channels 14i1a-f.

For example, in FIGS. 4 and 5 again, the downstream fluid path 5b comprises a single second intermediate channel 14i2a. In FIGS. 6 to 9, there are a plurality of second intermediate channels 14i2a-d, such as, for example, three in FIGS. 6, 7 and 9 or, for example, four in FIG. 8. The second intermediate channels 14i2a-d may comprise different individual cross-sections or identical cross-sections, as illustrated in FIGS. 6 to 9.

Furthermore, at least one of the channels 14 which comprises a given fluid path 5a, 5b may comprise a restriction 16, 16' in order to locally increase the circulation speed of the heat transfer fluid F through the circuit 5. This increase promotes the filling of the most remote channels, such as the first intermediate channel 14i1e or the second intermediate channel 14i2c or d and improves the thermal homogeneity within the same zone Z1 or Z2.

For example, in FIGS. 6 to 8, a first restriction 16 is provided on the first outlet channel 14s1 of the upstream fluid path 5a, in the connection zone R1 thereof with the second inlet channel 14e2 of the downstream fluid path 5b. A second restriction 16' is provided on the first inlet channel 14e1 of the upstream fluid path 5a in the connection zone R2 thereof with the first connection channel 14j1 which connects it to the inlet mouth 7.

Such a restriction is a local reduction of the passage cross-section of the heat transfer fluid.

The invention claimed is:

1. A device which is dedicated to the thermal processing of an electrical component of a motor vehicle, the device comprising:
   a thermoelectric module with a Peltier effect which is thermally connected to one of a plurality of large faces of a casing which accommodates a circuit of heat transfer fluid,
   wherein in a direction of circulation of the heat transfer fluid through the circuit, the circuit comprises at least two fluid paths which are arranged in series and provided in different zones of the casing, including at least one upstream fluid path provided inside a first zone and at least a downstream fluid path provided inside a second zone,
   the casing being delimited by a first large face which is in direct thermal contact with the thermoelectric module and by a second large face which is arranged to be in direct thermal contact with the electrical component.

2. The device as claimed in claim 1,
   wherein the first zone and the second zone each extend at least partially over the extent of a first contact surface between the casing and the thermoelectric module and over a second surface of the casing which is capable of coming into contact with the electrical component, and
   wherein the thermoelectric module and the electrical component are disposed on two opposing sides of the casing.

3. The device as claimed in claim 1, wherein the fluid paths are arranged with spacing from each other, providing a thermal break zone between the first zone and the second zone.

4. The device as claimed in claim 1, wherein each of the fluid paths comprises, on the one hand, an inlet channel and an outlet channel for the heat transfer fluid which extends along a length of the casing and, on the other hand, at least one intermediate channel which connects the inlet channel and the outlet channel to each other and which extends over a width of the casing.

5. The device as claimed in claim 4, wherein the intermediate channels have identical cross-sections.

6. The device as claimed in claim 4, wherein at least two intermediate channels have different cross-sections.

7. The device as claimed in claim 5, wherein a cross-section of the intermediate channels is less than a cross-section of the inlet channel and/or the outlet channel.

8. The device as claimed in claim 5, wherein the intermediate channels change direction at least twice in their main axis of extent.

9. The device as claimed in claim 1, wherein at least one of the channels which forms the circuit comprises at least one restriction of the passage cross-section of the heat transfer fluid.

10. The device as claimed in claim 9, wherein the restriction is provided locally in the region of the inlet channel.

11. The device as claimed in claim 1, wherein the cross-section of at least any one of the channels forming the circuit is variable.

12. The device as claimed in claim 1, wherein the circuit is connected to at least one inlet mouth which forms a pipe for introducing the heat transfer fluid inside the circuit, and at least one outlet mouth which forms a pipe for discharging the heat transfer fluid out of the circuit, the inlet mouth and the outlet mouth each opening outside the casing at any one of a plurality of lateral faces thereof which extend between the large faces thereof.

13. The device as claimed in claim 1,
wherein the casing is formed by a hollow body which delimits a cavity which forms the circuit, the body incorporating at least one partition which delimits at least the fluid path, the cavity being closed by at least one cover, a base of the body forming the first large face of the casing and the cover forming the second large face of the casing,
wherein the base of the body is in direct thermal contact with the thermoelectric module, and wherein the cover is in direct thermal contact with the electrical component.

14. The device as claimed in claim 13, wherein the body is formed by an integral component which is produced equally well by molding or by machining a metal component.

15. A cooling system comprising:
a device having a thermoelectric module with a Peltier effect which is thermally connected to one of a plurality of large faces of a casing which accommodates a circuit of heat transfer fluid,
wherein in a direction of circulation of heat transfer fluid through the circuit, the circuit comprises at least two fluid paths which are arranged in series and provided in different zones of the casing, including at least one upstream fluid path provided inside a first zone and at least a downstream fluid path provided inside a second zone,
the casing being delimited by a first large face which is in direct thermal contact with the thermoelectric module and by a second large face which is arranged to be in direct thermal contact with an electrical component; and
the electrical component of a motor vehicle, the electrical component being in direct thermal contact with the second large face which delimits the casing.

* * * * *